(12) United States Patent
Grill et al.

(10) Patent No.: US 6,265,779 B1
(45) Date of Patent: Jul. 24, 2001

(54) METHOD AND MATERIAL FOR INTEGRATION OF FUORINE-CONTAINING LOW-K DIELECTRICS

(75) Inventors: Alfred Grill, White Plains; Christopher Vincent Jahnes, Monsey; Vishnubhai Vitthalbhai Patel, Yorktown Heights; Katherine Lynn Saenger, Ossining, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/132,608

(22) Filed: Aug. 11, 1998

(51) Int. Cl.$^7$ ................ H01L 21/283; H01L 21/314; H01L 21/316

(52) U.S. Cl. .............. 257/759; 257/762; 257/763; 438/623; 438/624; 438/643; 438/644

(58) Field of Search ................ 438/618, 622, 438/623, 625, 627, 642, 643, 648, 650, 651, 652, 653, 655, 656; 257/635, 641, 642, 644, 650, 701, 702, 748, 750, 751, 754, 757, 759, 761–766, 770

(56) References Cited

U.S. PATENT DOCUMENTS

| | | | |
|---|---|---|---|
| 4,719,154 | * | 1/1988 | Hatwar ................................. 428/694 |
| 5,470,661 | | 11/1995 | Bailey et al. ...................... 428/408 |
| 5,492,736 | * | 2/1996 | Laxman et al. .................... 427/579 |
| 5,559,367 | | 9/1996 | Cohen et al. ......................... 257/77 |
| 5,563,105 | * | 10/1996 | Dobuzinsky et al. ............... 438/784 |
| 5,571,576 | * | 11/1996 | Qian et al. ........................... 427/574 |
| 5,646,440 | * | 7/1997 | Hasegawa ........................... 257/635 |
| 5,660,895 | * | 8/1997 | Lee et al. ............................ 427/579 |
| 5,679,982 | * | 10/1997 | Gardner .............................. 257/758 |
| 5,756,222 | * | 5/1998 | Bercaw et al. ..................... 428/649 |
| 5,937,323 | * | 8/1999 | Orczyk et al. ...................... 438/624 |
| 5,968,847 | * | 10/1999 | Ye et al. .............................. 438/734 |
| 6,002,176 | * | 12/1999 | Nguyen et al. ..................... 257/762 |
| 6,025,264 | * | 2/2000 | Yew et al. ........................... 438/627 |
| 6,054,380 | * | 4/2000 | Naik .................................... 438/624 |
| 6,054,398 | * | 4/2000 | Pramanick ......................... 438/784 |

OTHER PUBLICATIONS

K.F. Spear et al. Synthetic Diamond: Emerging CVD science and Technology, Chapter 5 by a. Grill et al. John Wiley and Sons, New York 1994.

* cited by examiner

Primary Examiner—Olik Chaudhuri
Assistant Examiner—Theresa Doan
(74) Attorney, Agent, or Firm—Robert M. Trepp (57) ABSTRACT

Metal and insulator interconnect structures are described incorporating one or more layers of fluorinated dielectric insulation, one or more conductive wiring levels interconnected by vias and capping and/or liner materials to physically isolate the wiring levels and vias from the fluorinated dielectric such as fluorinated diamond like carbon which has a low dielectric constant. The invention overcomes the problem that can arise when fluorine in the fluorinated dielectric insulation reacts with other materials in the interconnect structure to produce unwanted fluorine-containing compounds that can interfere with the structure's mechanical integrity or interconnect function.

18 Claims, 10 Drawing Sheets

METHOD AND MATERIAL FOR INTEGRATION OF FUORINE-CONTAINING LOW-K DIELECTRICS

FIELD OF THE INVENTION

The present invention relates to metal/insulator interconnect structures found in Very Large Scale Integrated (VLSI) and Ultra Large Scale Integrated (ULSI) circuits and packaging, and more particularly to interconnect structures comprising fluorine-containing low-k dielectrics and capping and/or liner materials selected to prevent reliability problems associated with out-diffusion of fluorine from the low-k dielectric into other parts of the structure.

BACKGROUND OF THE INVENTION

Device interconnections in Very Large Scale Integrated (VLSI) circuits or Ultra-Large Scale Integrated (ULSI) circuits or semiconductor chips are typically effected by multilevel interconnect structures containing patterns of metal wiring layers called traces. Wiring structures within a given trace or level of wiring are separated by an intralevel dielectric, while the individual wiring levels are separated from each other by layers of an interlevel dielectric. Conductive vias are formed in the interlevel dielectric to provide interlevel contacts between the wiring traces.

By means of their effects on signal propagation delays, the materials and layout of these interconnect structures can substantially impact circuit speed, and thus circuit performance. Signal propagation delays are due to RC time constants wherein R is the resistance of the on-chip wiring, and C is the effective capacitance between the signal lines and the surrounding conductors in the multilevel interconnection stack. RC time constants are reduced by lowering the specific resistance of the wiring material, and by using interlevel and intralevel dielectrics (ILDs) with lower dielectric constants.

The low dielectric constants of fluorine-containing dielectrics such as fluorinated diamond-like-carbon (FDLC) and fluorinated silicon glass (FSG) make them potentially useful as ILD materials in high performance VLSI and ULSI chips where interconnect wiring capacitance must be minimized. This use for FDLC is discussed by S. A. Cohen et al. in U.S. Pat. No. 5,559,367, entitled "Diamond-like carbon for use in VLSI and ULSI interconnect systems." FDLC films can be fabricated by a variety of methods including sputtering, ion beam sputtering, and dc or rf plasma assisted chemical vapor deposition with a variety of carbon-bearing source materials, as described for non-fluorinated DLC films by A. Grill and B. S. Meyerson, "Development and Status of Diamond-like Carbon," Chapter 5, in Synthetic Diamond: Emerging CVD Science and Technology, editors K. E. Spear and J. P. Dismukes, John Wiley and Sons, New York 1994, and F. D. Bailey et al. in U.S. Pat. No. 5,470,661 which issued Nov. 28, 1995. However, fluorine-containing ILDs such as FDLC cannot be integrated into these interconnect structures without taking suitable precautions such as capping layers to prevent fluorine in the FDLC from reacting with other materials in the interconnect structure during required processing steps at elevated temperatures above 300° C. While ILDs with reduced fluorine content would be expected to have smaller amounts of fluorine available to react with other materials, lower fluorine-content ILDs typically also have undesirably higher k values.

Capping materials such as the insulators silicon oxide and silicon nitride, and the conductive material TaN have been previously described for use with non-fluorine containing ILDs as (i) diffusion barriers (to prevent atoms of wiring material from diffusing into the ILD from where they may readily diffuse into active device regions), (ii) etch stop and permanent masking materials, and (iii) adhesion layers.

However, these conventional capping materials are not compatible with FDLC as indicated by capping material delamination and cracking in layered Si/FDLC (1000 nm) cap samples after a 350° C. anneal in He for 4 hours. Poor adhesion, delamination, and even cracking were present in samples where the FDLC had been given a "stabilization" anneal of 400° C. in He for 4 hours prior to capping.

Figure 1:
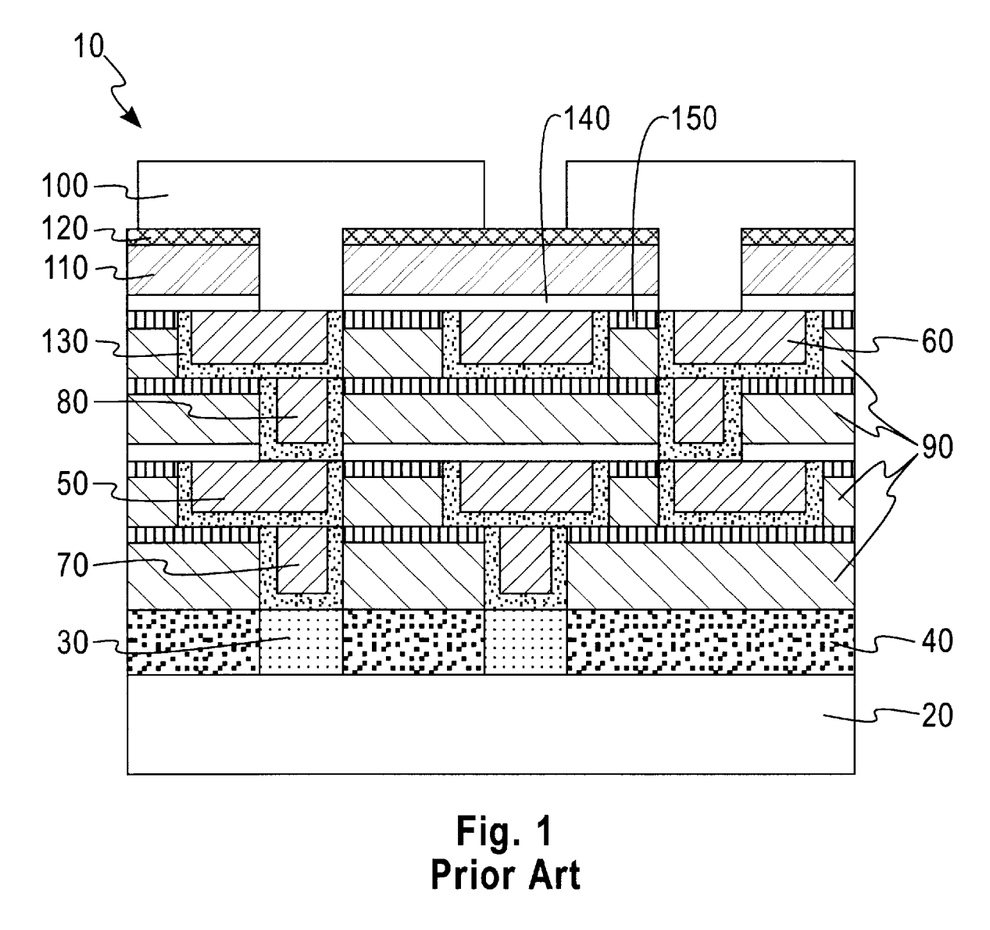
FIG. 1 shows a schematic cross section view of a generic prior art interconnect structure comprising two wiring levels.

Prior art utilization of capping materials such as silicon oxide, silicon nitride, and TaN in multilayer interconnect structures is illustrated in FIGS. 1, 2, 3A and 3B. FIG. 1 shows a schematic cross section view of a generic, 2-wiring-level interconnect structure 10. Interconnect structure 10 comprises substrate 20, conductive device contacts 30 in a first dielectric 40, a first and second level of conductive wiring (50, 60), and two layers of conductive vias (70, 80) embedded in layers of a second dielectric 90. Conductive wiring layers (50, 60) and vias (70, 80) are typically low-resistivity metals, for example, Al, Al alloyed with Cu or other elements, Cu, Cu alloys, or any of these materials, alone or in combination, doped with dopants, additives or impurities selected to improve electromigration properties. Contacts to packaging dies are provided by conductive contact pads 100 in a third dielectric 110 and insulating environmental isolation layer 120. Interconnect structure 10 incorporates three capping materials: a conductive capping or liner material 130 lining the sidewalls and bottom surfaces of the conductive wiring and vias, an insulating capping material layer 140 overlying each wiring level over those areas not contacted by an overlying via, and an optional insulating capping layer 150 over some or all (shown) of each layer of dielectric 90. Conductive liner or capping material 130 acts to provide adhesion and prevent metal diffusion into dielectric 90; its conductivity provides electrical redundancy, and allows it to remain in the contact regions between conductive features in different levels. Insulating capping material 140 primarily serves to prevent metal diffusion into the overlying dielectric layers, but prevents other potentially undesirable interactions as well. Insulating capping material 150 is optionally left in the structure after use as an etch mask, etch stop, and/or polish stop during interconnect structure fabrication.

Interconnect structure 10 of FIG. 1 would typically be fabricated by Damascene processing in which layers of dielectric are sequentially deposited, patterned to form cavities corresponding to the pattern of conductive material desired, overfilled with the conductive material, and then planarized to remove conductive material above the dielectric. This process is repeated as necessary for each additional layer.

Figure 2:
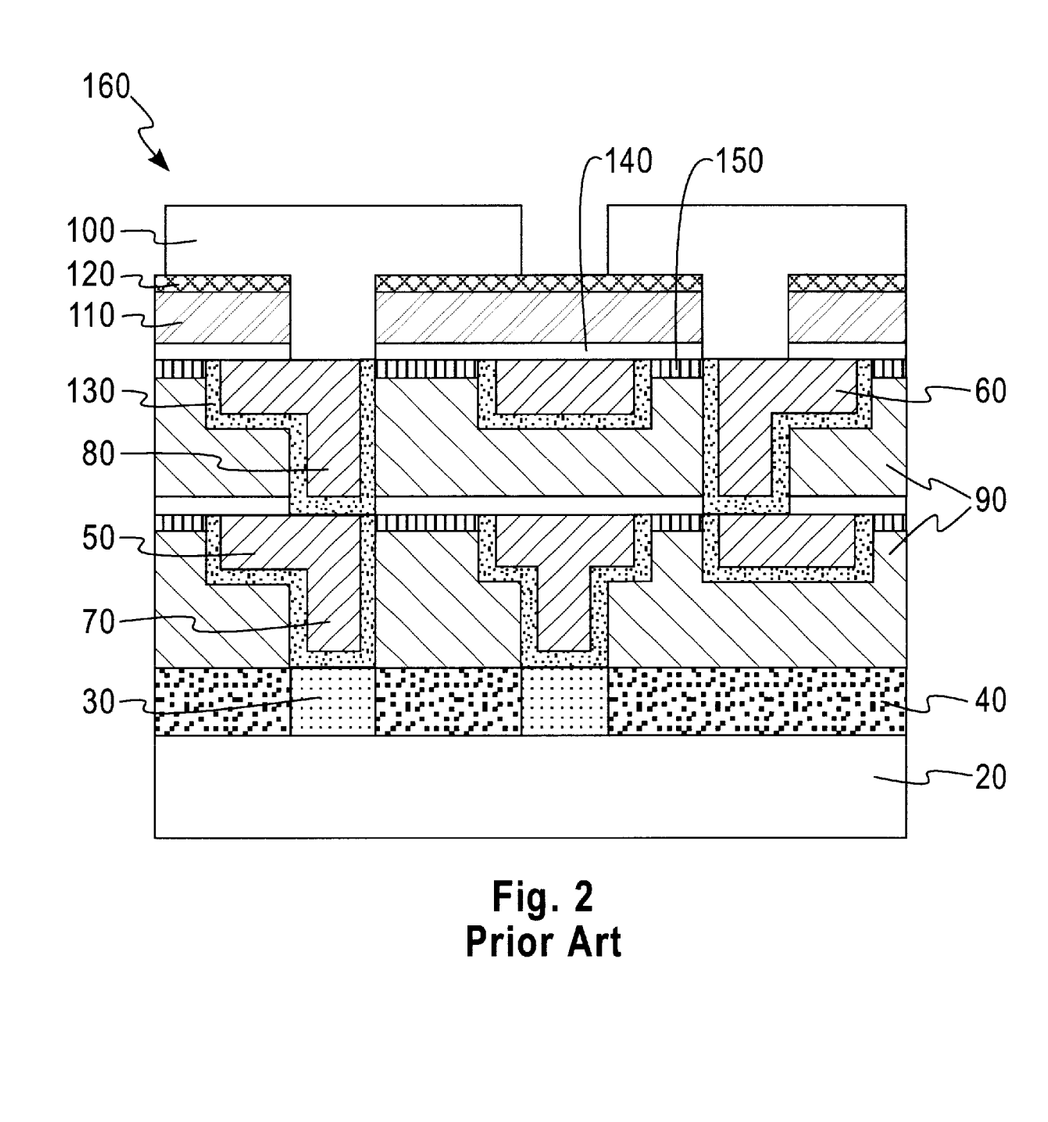
FIG. 2 shows a schematic cross section view of a variation of the generic prior art interconnect structure of FIG. 1.

Interconnect structures may also be fabricated by Dual Damascene processing, in which approximately double thicknesses of second dielectric material 90 are patterned with dual relief cavities corresponding to the pattern of a wiring level and its underlying via level. FIG. 2 shows a schematic cross section view of a prior art 2-wiring-level interconnect structure 160 analogous to interconnect structure 10 in FIG. 1, except that the disposition of the capping materials 130 and 150 reflects the Dual Damascene method of processing. For example, since wiring level 60 and its underlying via level 80 are filled with conductive material in the same deposition step, there is no conductive cap material 130 between 50 and 70, a characteristic distinguishing feature of all Dual Damascene processed interconnect structures.

Figure 3A:
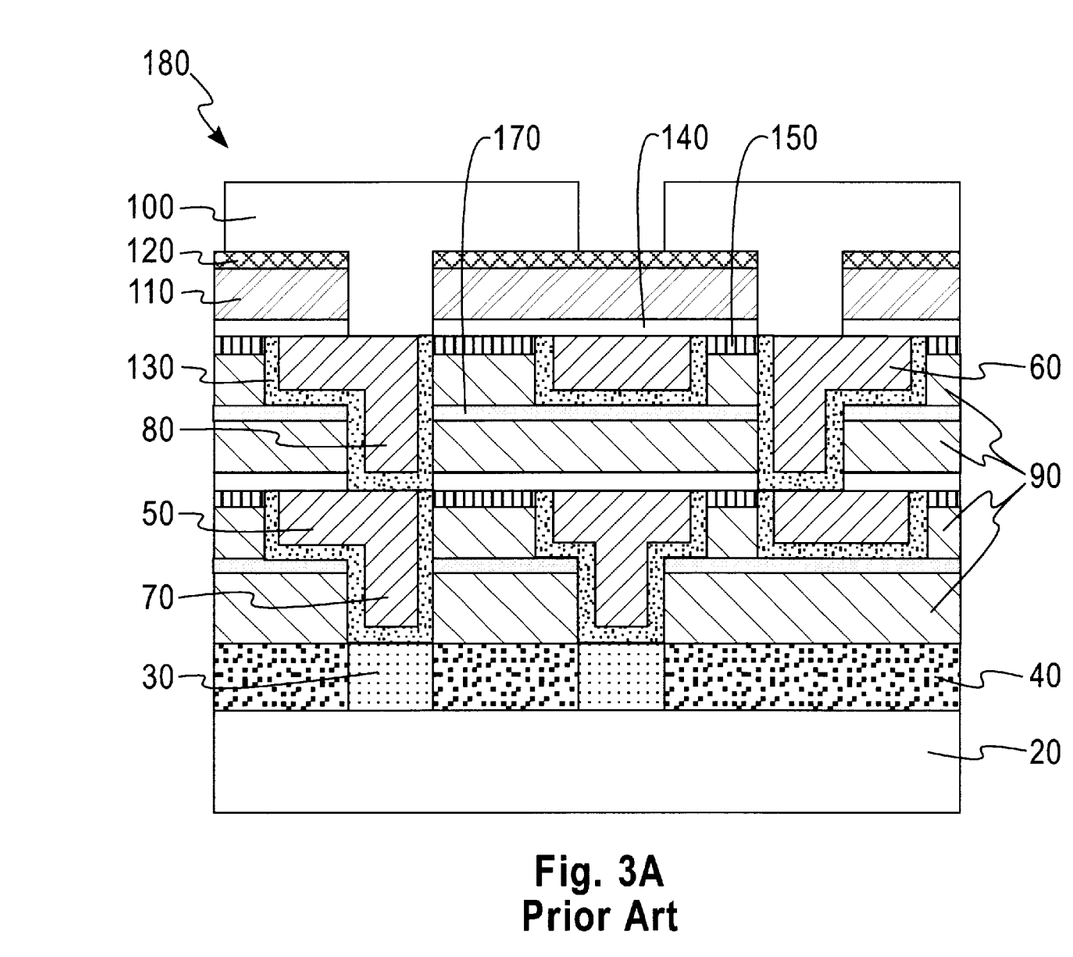
FIGS. 3A and 3B show a schematic cross section view of two more variations of the generic prior art interconnect structure of FIG. 1.
Figure 3B:
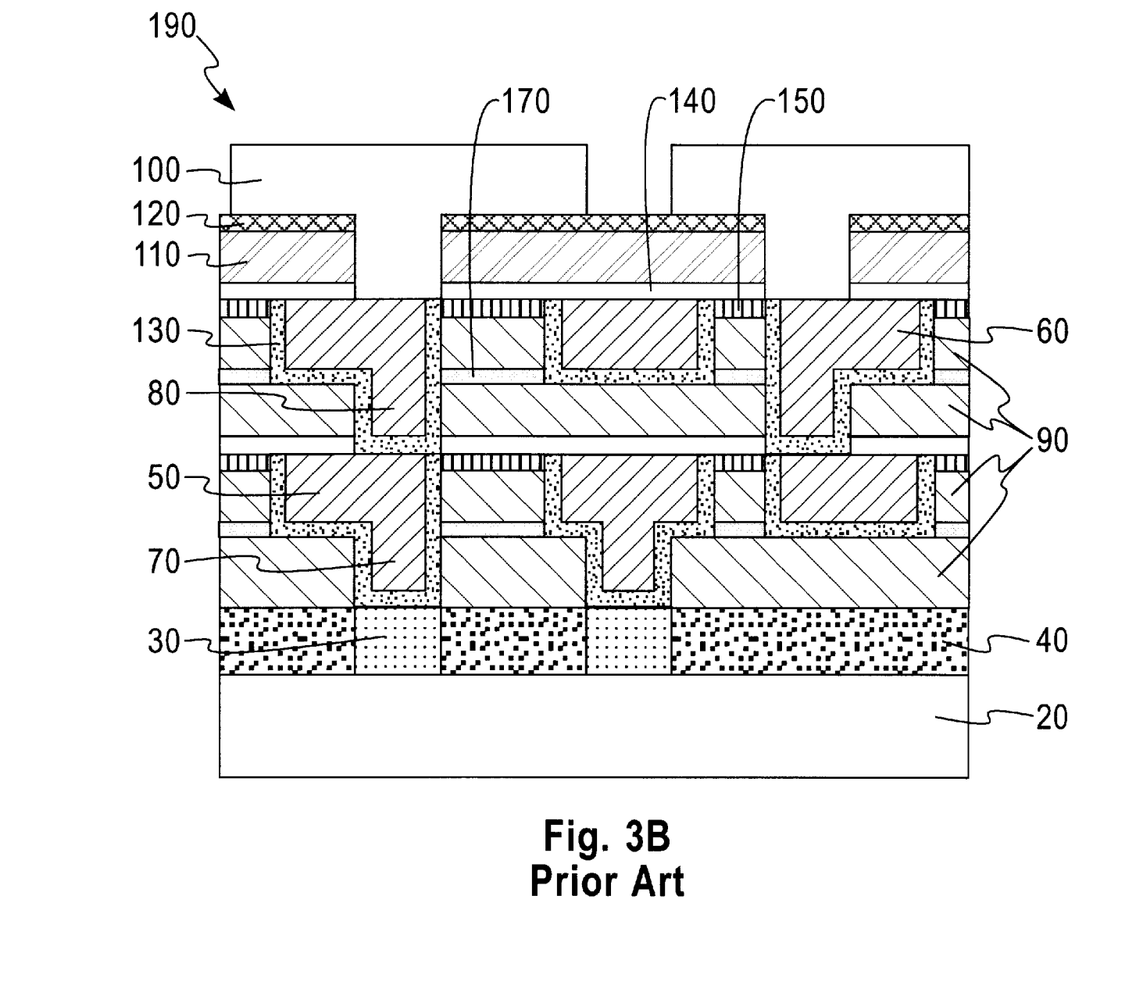

FIGS. 3A and 3B show two other Dual Damascene processed interconnect structures similar to interconnect structure 160 of FIG. 2, but different in the presence of insulating cap layer 170, used as an etch stop to facilitate the patterning of the dual relief cavities in the double (via plus wiring level) layers of the second dielectric material 90. In interconnect structure 180 in FIG. 3A, exposed regions of etch stop layer 170 are not removed before filling the dual relief cavities with conductive material; in interconnect structure 190 in FIG. 3B, exposed regions of etch stop layer 170 are removed before filling the dual relief cavities with conductive material.

While the interconnect structures 10, 160, 180 and 190 show two wiring levels, the number of wiring levels may be as few as one or as many as ten or more.

It is thus an object of this invention to provide a high performance interconnect structure comprising one or more layers of fluorinated dielectric insulation and one or more conductive wiring levels electrically connected by conductive vias, said wiring levels and vias completely isolated from the fluorinated dielectric by at least one fluorine-resistant capping and/or liner material.

It should be noted that the term "fluorine-resistant" is meant to describe materials that do not readily react with fluorine to form fluorine-containing compounds that interfere with the function or the mechanical integrity of the interconnect structure.

It is a further object of this invention to provide a high performance interconnect structure comprising one or more layers of fluorinated dielectric insulation and one or more conductive wiring levels electrically connected by conductive vias, said wiring levels and vias isolated from the fluorinated dielectric on a first set of selected surfaces by at least one electrically insulating fluorine-resistant capping material, and isolated from the fluorinated dielectric on a second set of selected surfaces by at least one electrically conductive fluorine-resistant capping and/or liner material.

It is yet a further object of this invention to provide a high performance interconnect structure comprising one or more layers of fluorinated dielectric insulation and one or more conductive wiring levels electrically connected by conductive vias, said wiring levels and vias levels and vias completely isolated from the fluorinated dielectric by at least one fluorine-resistant capping and/or liner material.

It is another object of this invention to provide a method for forming a high performance interconnect structure comprising one or more layers of fluorinated dielectric insulation and one or more conductive wiring levels electrically connected by conductive vias, said wiring levels and vias completely isolated from the fluorinated dielectric by at least one fluorine-resistant capping and/or liner material.

SUMMARY OF THE INVENTION

The present invention relates to metal/insulator interconnect structures found in Very Large Scale Integrated (VLSI) and Ultra Large Scale Integrated (ULSI) circuits and packaging, and more particularly to interconnect structures comprising fluorine-containing low-k dielectrics and capping and/or liner materials selected to prevent reliability problems associated with out-diffusion of fluorine from the low-k dielectric into other parts of the structure. The capping/liner materials, selected from materials whose fluorides are either non-volatile or not strongly favored to form, may additionally function as (i) diffusion barriers (to prevent atoms of wiring material from diffusing into the insulator from where they may readily diffuse into active device regions), (ii) etch stop and etch mask materials, and (iii) adhesion layers. The fluorine-resistant capping/liner materials may be conventionally disposed, and/or disposed as layered combinations with conventional capping/liner materials in a geometry in which the conventional capping/liner material is protected from the fluorinated dielectric by the fluorine-resistant material.

An additional aspect of this invention further relates to methods for forming a high performance interconnect structure comprising one or more layers of fluorinated dielectric insulation and one or more conductive wiring levels electrically connected by conductive vias.

BRIEF DESCRIPTION OF THE DRAWINGS

These and other features, objects, and advantages of the present invention will become apparent upon a consideration of the following detailed description of the invention when read in conjunction with the drawing, in which.

DESCRIPTION OF THE PREFERRED EMBODIMENTS

The interconnect structures of the present invention comprise layers of fluorinated dielectric and capping/liner materials selected from materials whose fluorides are either non-volatile or not strongly favored to form. The fluorinated dielectric may be selected from the group containing fluorinated diamond like carbon (FDLC), fluorinated amorphous carbon (FLAC), FDLC or FLAC with additives selected from the group consisting of H, Si, Ge, O and N, fluorinated silicon glass (FSG), inorganic halogen-containing dielectrics and organic halogen-containing dielectrics.

Potentially suitable insulating capping materials include the insulating oxides, nitrides, or fluorides of the elements Ag, Al, Co, Cr, In, Ir, Mg, Mn, Sn, mixtures and multilayers thereof, and amorphous silicon-containing carbon-based materials such as Si-containing DLC and Si-O-containing DLC. Potentially suitable conductive capping/liner materials include the metals Ag, Al, Al-Ti, Co, Cr, Cu, In, Ir, Mg, Mn, Pd, Pt, Sn and their conductive oxides (e.g., IrO2 and PdO), fluorides, nitrides, or silicides (e.g., PtSi), and mixtures and multilayers thereof. The fluorine-resistant capping/liner materials in the disclosed interconnect structure may be deposited by chemical vapor deposition (CVD), plasma enhanced CVD (PECVD), or physical vapor deposition processes such as sputtering or reactive sputtering. In addition, PdO may possibly be deposited by electrochemical (anodic) oxidation of Pd.

Some preferred embodiments of the present invention are illustrated by the two-wiring-level interconnect structures 200, 210, 220, 230, 300 and 400 in FIGS. 4, 5, 6A–6B, 7 and 8 which are different from the prior art structures 10, 160, 180, and 190 in FIGS. 1, 2, and 3A–3B in the use of (i) fluorinated dielectric 250 as the second dielectric material, and (ii) fluorine-resistant conductive capping/liner materials. Interconnect structure 200 incorporates three capping materials: a conductive capping or liner material 260 lining the sidewalls and bottom surfaces of the conductive wiring and vias, an insulating capping material layer 270 overlying each wiring level over those areas not contacted by an overlying via, and an optional insulating capping layer 280 over some or all (shown) of each layer of dielectric 250. As in the case of interconnect structure 10 in FIG. 1, conductive liner or capping material 260 acts to provide adhesion and prevent metal diffusion into dielectric 250; its conductivity provides electrical redundancy, and allows it to remain in the contact regions between conductive features in different levels. Insulating capping material 270 primarily serves to prevent metal diffusion into the overlying dielectric layers, but prevents other potentially undesirable interactions as well. Insulating capping material 280 is optionally left in the structure after use as an etch mask, etch stop, and/or polish stop during interconnect structure fabrication.

Figure 4:
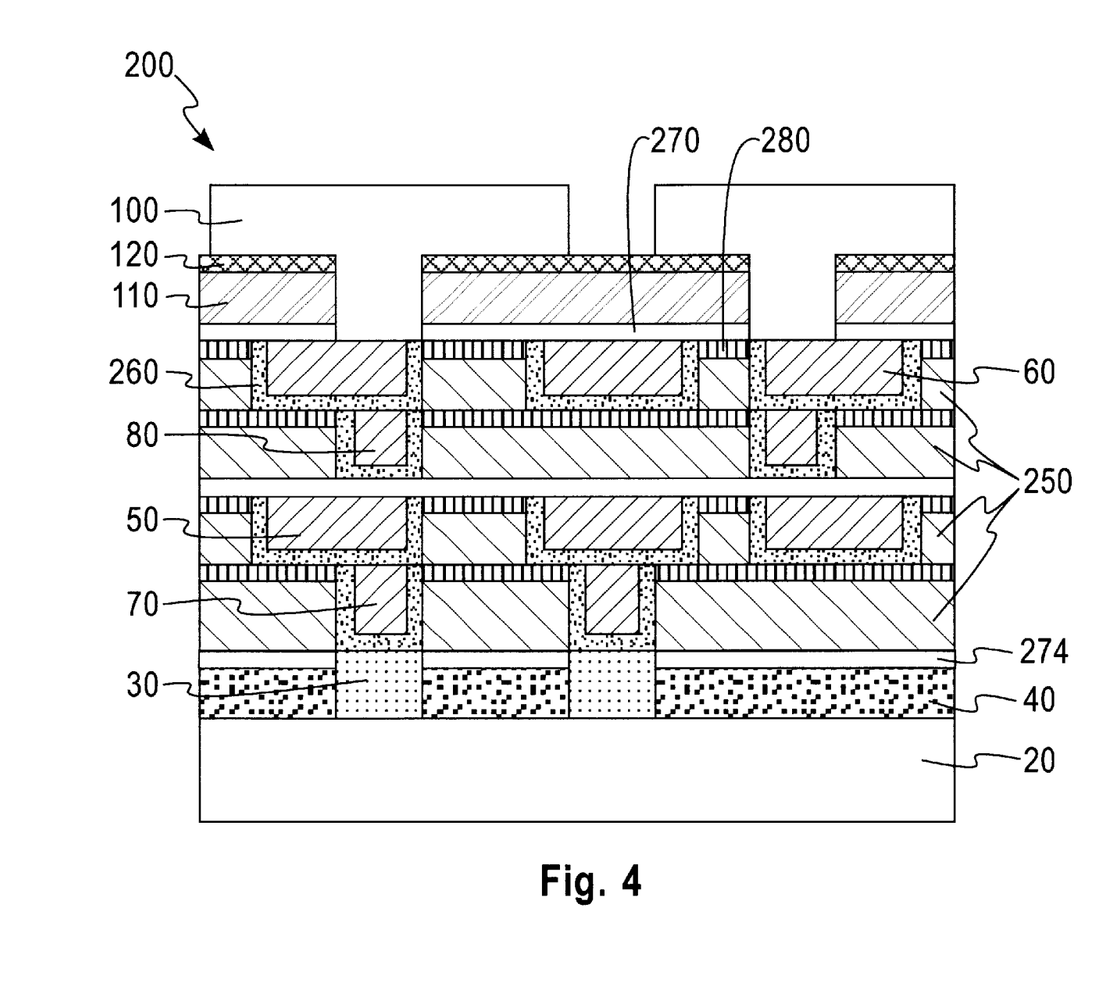
FIG. 4 shows a schematic cross section view of a two-wiring-level interconnect structure comprising an embodiment of the present invention analogous to the prior art structure of FIG. 1.

An additional layer of insulating flourine resistant capping material 274 may also be disposed between first dielectric 40 and fluorinated dielectric 250 to improve adhesion and prevent formation of any fluorine-containing compounds that may interfere with the function of the interconnect structure.

Figure 5:
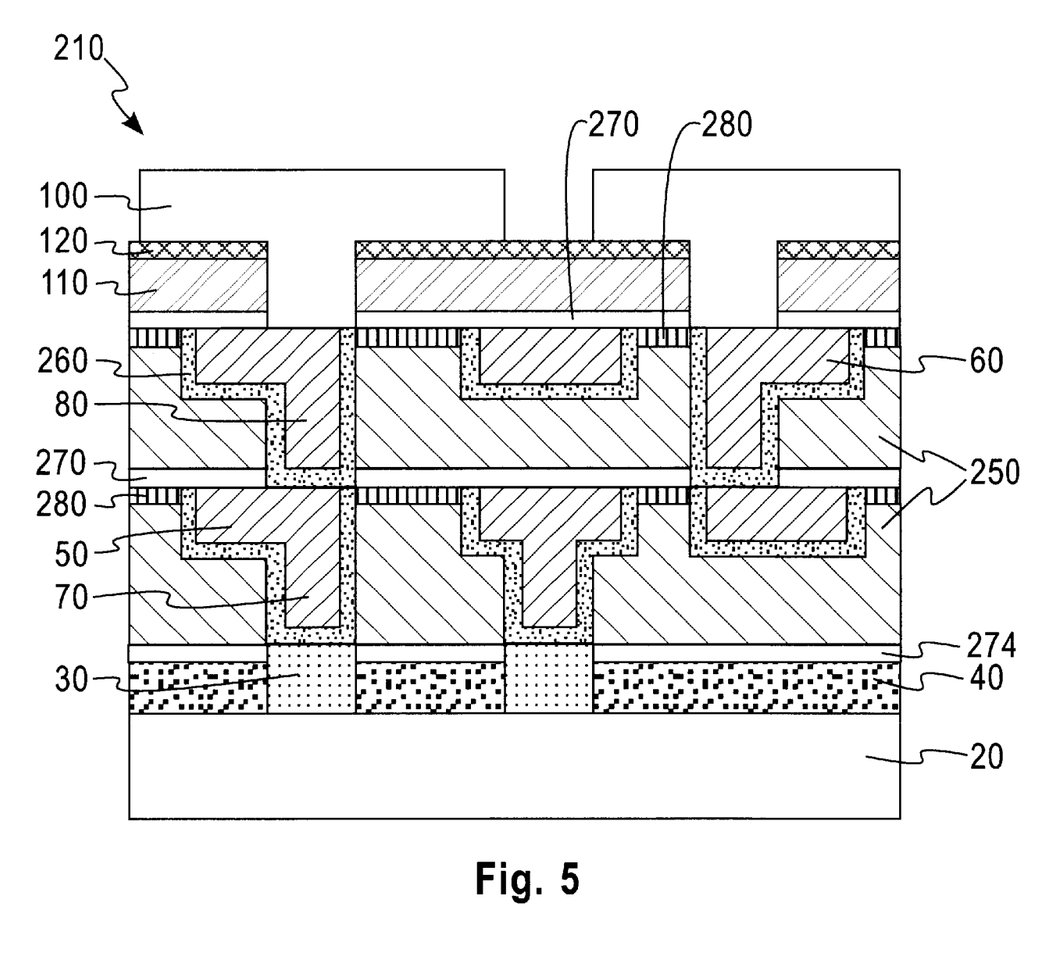
FIG. 5 shows a schematic cross section view of a two-wiring-level interconnect structure comprising an embodiment of the present invention analogous to the prior art structure of FIG. 2.

FIG. 5 shows a schematic cross section view of another embodiment of a two-wiring-level interconnect structure 210 analogous to interconnect structure 200 in FIG. 4, except that the disposition of the capping materials 260 and 280 reflects the Dual Damascene method of processing. For example, since wiring level 60 and its underlying via level 80 are filled with conductive material in the same deposition step, there is no conductive cap material 260 between 50 and 70, a characteristic distinguishing feature of all Dual Damascene processed interconnect structures.

Figure 6A:
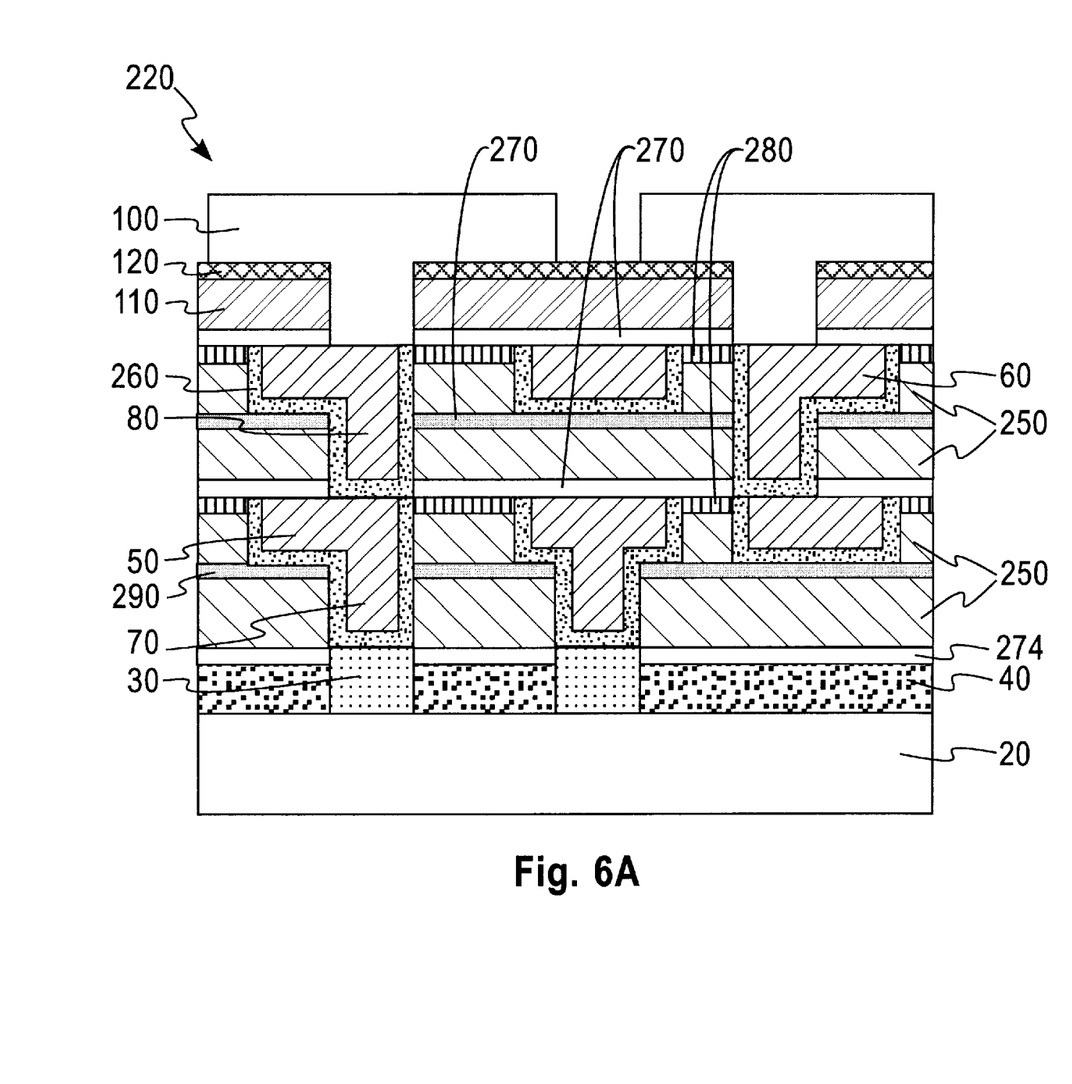
FIGS. 6A and 6B show a schematic cross section view of a two-wiring-level interconnect structure comprising an embodiment of the present invention analogous to the prior art structures of FIGS. 3A and 3B.
Figure 6B:
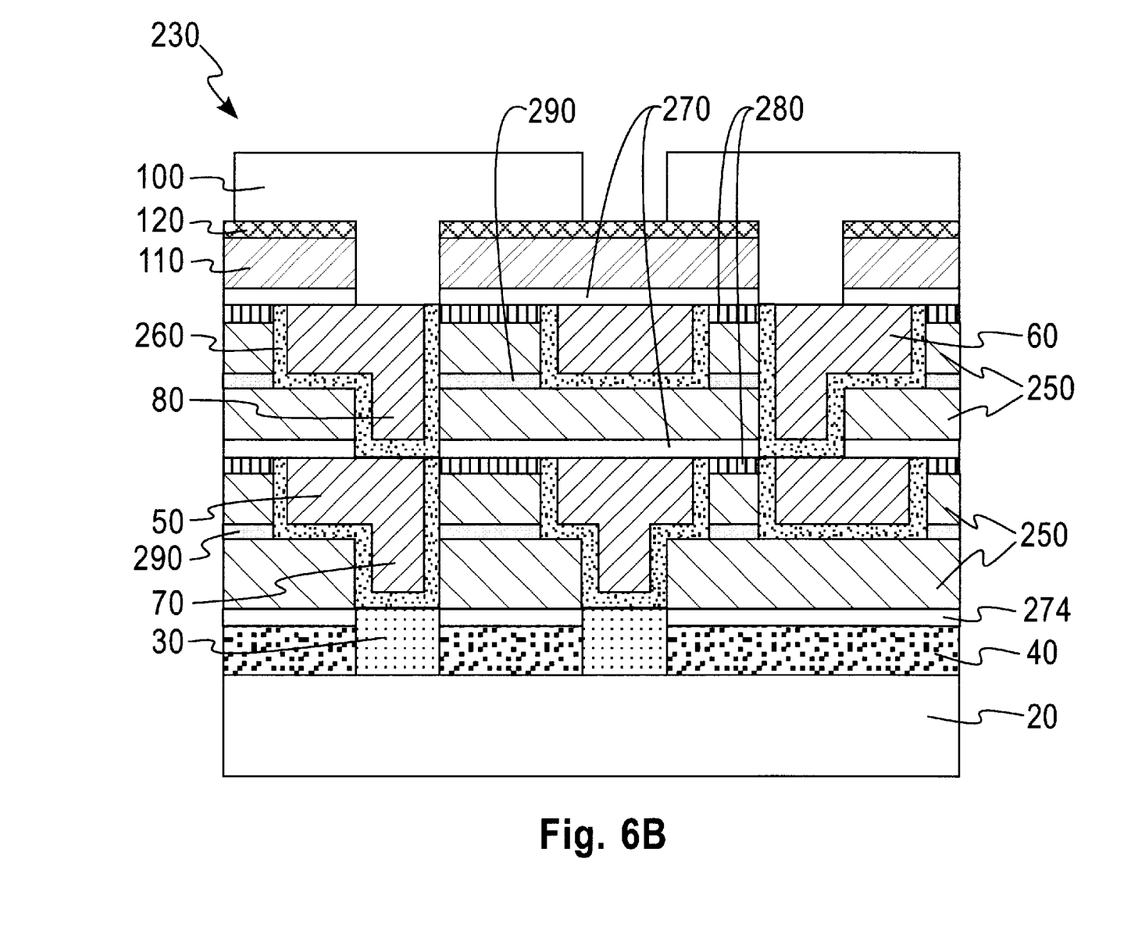

FIGS. 6A and 6B show two other embodiments of Dual Damascene processed interconnect structures similar to interconnect structure 210 of FIG. 5, but different in the presence of insulating cap layer 290, used as an etch stop to facilitate the patterning of the dual relief cavities in the double (via plus wiring level) layers of the second dielectric material 250. In interconnect structure 220 in FIG. 6A, exposed regions of etch stop layer 290 are not removed before filling the dual relief cavities with conductive material; in interconnect structure 230 in FIG. 6B, exposed regions of etch stop layer 290 are removed before filling the dual relief cavities with conductive material.

Figure 7:
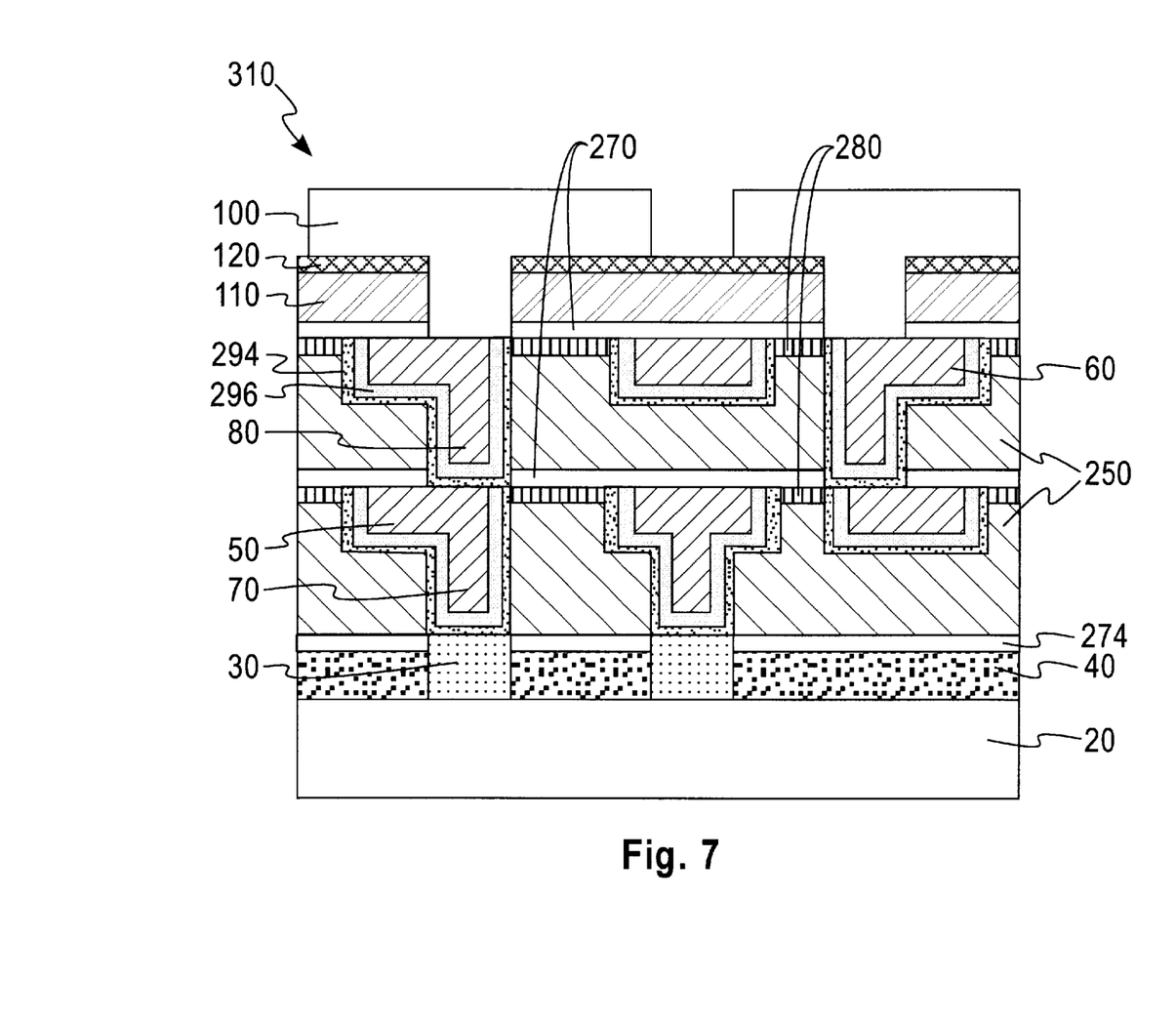
FIG. 7 shows a schematic cross section view of another embodiment of the two-wiring-level interconnect structure of FIG. 5.

The fluorine-resistant capping/liner materials 260 of FIGS. 4, 5, 6A and 6B may be conventionally disposed, as shown, or disposed as layered combinations with conventional capping/liner materials in a geometry in which the conventional capping/liner material is protected from the fluorinated dielectric by the fluorine-resistant capping/liner material. FIG. 7 shows a layered combination geometry embodiment of the interconnect structure of FIG. 5. Liner/capping layers 260 are replaced by layers of conductive, fluorine-resistant material 294 and conductive barrier material 296 which may or may not be fluorine-resistant. Conductive fluorine-resistant capping/liner material 294 may be selected from the above mentioned list of fluorine-resistant conductive materials, while conductive barrier material 296 may be a barrier material such as the refractory metals including W or Ta, and the refractory metal nitrides and metal silicon nitrides, including TaN, TaSiN, ZrN, ZrSiN, HfN, HfSiN, TiN, TiSiN, WN, and WSiN, and combinations thereof (e.g., Ta in combination with TaN).

Figure 8:
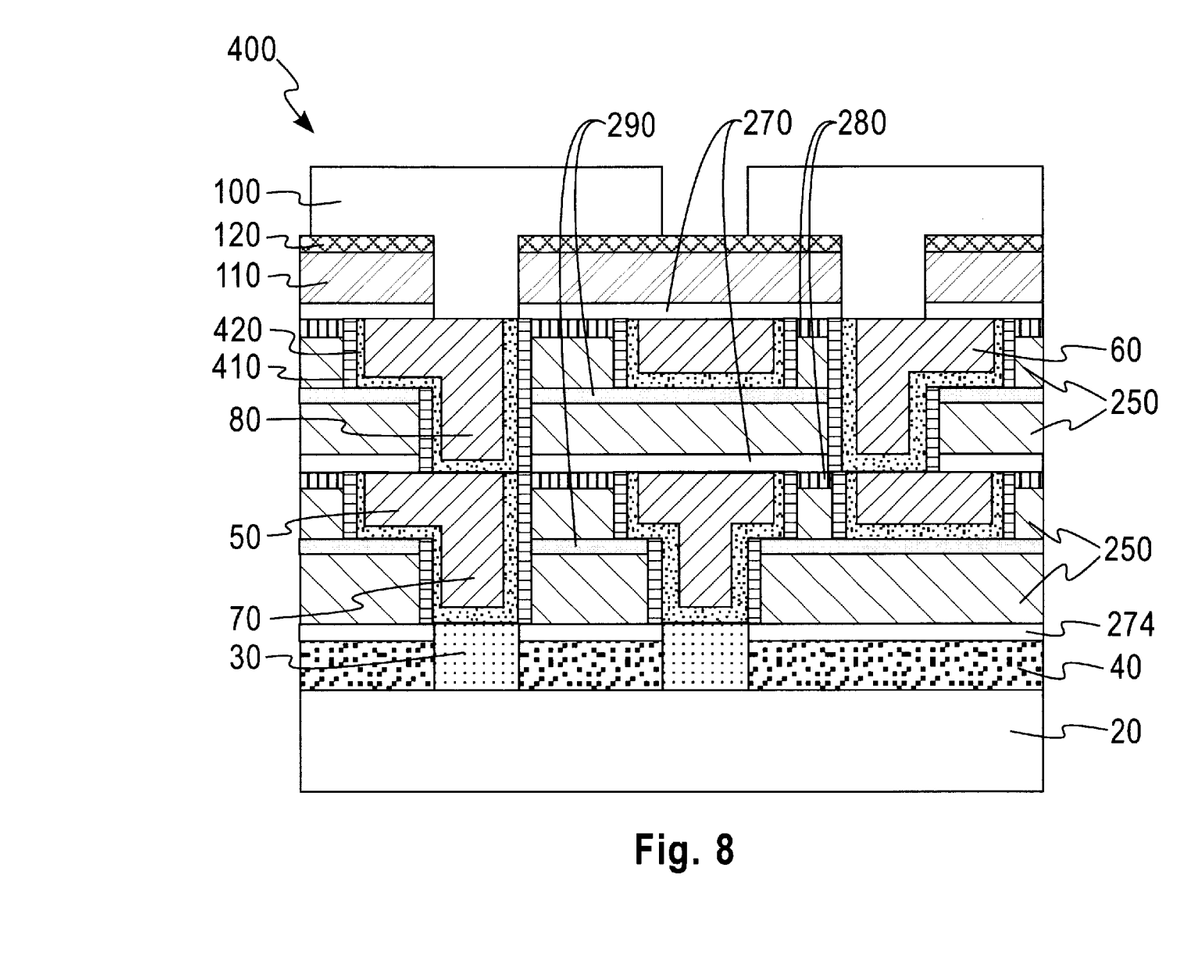
FIG. 8 shows a schematic cross section view of a two-wiring-level interconnect structure comprising a different embodiment of the present invention.

FIG. 8 shows a schematic cross section view of a different preferred embodiment of the present invention. Like the interconnect structures 200, 210, 220, and 230, two-wiring-level interconnect structure 400 in FIG. 8 utilizes a fluorinated dielectric 250 and insulating fluorine-resistant capping materials 270 and 280. However, structure 400 differs from the former structures in that it does not require the use of a conductive fluorine-resistant capping/liner material 260. In interconnect structure 400, capping material 260 is replaced by the combination of a fluorine-resistant material 410 which may or may not be conductive, and a conductive liner material 420 which may or may not be fluorine-resistant. Fluorine-resistant material 410 is disposed on the sidewalls of fluorinated dielectric 250. Conductive liner 420 is disposed as a continuous coating on the sidewalls and bottom surfaces of the conductive wiring and vias. Conductive liner 420 provides electrical redundancy, and may also function as a seed or plating base layer to facilitate formation of conductive features 50 and 70.

Relative to structures 200, 210, 220, and 230, structure 400 has the advantage of not requiring a single material to be fluorine-resistant, electrically conductive, and a barrier to the diffusion of the conductive material of the wiring and vias. Examples of suitable conductive liner materials which may not be fluorine-resistant include the refractory metals W and Ta, and the refractory metal nitrides and metal silicon nitrides including TaN, TaSiN, ZrN, ZrSiN, HfN, HfSiN, TiN, TiSiN, WN, WSiN, and combinations thereof.

While the interconnect structures 200, 210, 220, 230, 300 and 400 show two wiring levels, the number of wiring levels may be as few as one or as many as ten or more.

An additional aspect of this invention relates to methods for forming a high performance interconnect structure comprising one or more layers of fluorinated dielectric insulation and one or more conductive wiring levels electrically connected by conductive vias, said wiring levels and vias completely isolated from the fluorinated dielectric by at least one fluorine-resistant capping and/or liner material. In all of the following methods, it should be understood that 1) the fluorinated dielectric may be selected from the group containing fluorinated diamond like carbon (FDLC), fluorinated amorphous carbon (FLAC), FDLC or FLAC with additives selected from the group containing H, Si, Ge, O, and N, fluorinated silicon glass (FSG), and organic dielectrics containing fluorine;

2) the insulating fluorine-resistant capping materials may be selected from the group of insulating oxides, nitrides, or fluorides of the elements Ag, Al, Al—Ti, Co, Cr, Cu, In, Ir, Mg, Mn, Sn, mixtures and multilayers thereof, and amorphous silicon-containing carbon-based materials such as Si-containing DLC and Si-O-containing DLC; and 3) the conductive fluorine-resistant capping materials may be selected from group of metals Ag, Al, Al—Ti, Co, Cr, Cu, In, Ir, Mg, Mn, Pd, Pt, Sn and their conductive oxides (e.g., $IrO_2$ and PdO), fluorides, nitrides, or silicides (e.g., PtSi), and mixtures and multilayers thereof. The words "mixtures thereof" includes a fairly homogeneous combination such as an alloy or a combination of A/B layers.

Methods of producing these fluorine-resistant capping/liner materials include chemical vapor deposition (CVD)), plasma enhanced CVD (PECVD), and physical vapor deposition processes such as sputtering or reactive sputtering. In addition, PdO may possibly be deposited by electrochemical (anodic) oxidation of Pd.

EXAMPLE 1

A first preferred method for forming interconnect structures such as interconnect structure 210 shown in FIG. 5 comprises the steps of

- selecting a substrate 20 containing regions 30 that are conductive and regions 40 that are not conductive,
- optionally depositing on said substrate a blanket coating of a first capping material 274, said first capping material selected to be insulating and fluorine-resistant,
- depositing on said first capping material 274 or substrate regions 30 and 40 a blanket layer of fluorinated dielectric 250,
- optionally depositing at least one layer of masking material 280 on said fluorinated dielectric, said masking material 280 selected to be insulating and fluorine-resistant if it is to be left in the final structure,
- patterning said optionally deposited masking material 280 and said fluorinated dielectric 250 to form cavities in selected regions of said fluorinated dielectric 250 in such a manner as to provide at least some exposed regions of said first capping material 274 or conductive substrate regions 30,
- removing said exposed regions of first capping material 274, if present, to expose underlying conductive regions 30 on said substrate,
- optionally removing said masking material 280,
- selecting a first conductive material 260 identified as fluorine-resistant,
- providing a conformal coating of said first conductive material 260 to line said cavities,
- overfilling said cavities with a second conductive material 50,
- removing overfill of said second conductive material 50 by a planarizing process such as polishing,
- removing residuals of said first conductive material 260 from regions above said top surface of said masking material 280 or if removed then fluorinated dielectric 250,
- optionally removing said masking material 280, if not removed previously,
- and repeating these process steps until the desired number of wiring and via levels have been fabricated.

EXAMPLE 2

A second preferred method for forming interconnect structures such as that shown in FIGS. 6A and 6B comprises the steps of

- selecting a substrate 20 containing regions 30 that are conductive and regions 40 that are not conductive,
- optionally depositing on said substrate a blanket layer of a first capping material 274, said first capping material selected to be insulating and fluorine-resistant,
- depositing on said first capping material 274 or substrate regions 30 and 40 a blanket first layer of a fluorinated dielectric material 250,
- depositing on said first layer of said fluorinated dielectric material 250 a blanket layer of a second capping material 290, said second capping material 290 selected to be insulating and fluorine-resistant,
- depositing on said layer of second capping material 290 a blanket second layer of a fluorinated dielectric material 250,
- optionally depositing at least one layer of masking material 280, said masking material 280 selected to be insulating and fluorine-resistant if it is to be left in the final structure,
- patterning said optionally deposited masking material 280, said second layer of fluorinated dielectric 250, said second capping material 290, and said first layer of fluorinated dielectric 250 to form cavities in selected regions of said first and second fluorinated dielectric layers 250 in such a manner as to provide at least some exposed regions of said first capping material 274 or conductive regions 30,
- removing said exposed regions of first capping material 274, if present, to expose underlying regions 30 on said substrate,
- optionally removing exposed regions of said second capping material 290 previously covered by fluorinated dielectric 250,
- optionally removing said masking material 280,
- selecting a first conductive material identified as fluorine-resistant 260,
- providing a blanket coating of a first conductive material 260 to line said cavities,
- overfilling said cavities with a second conductive material 50, removing overfill of said second conductive material 50 by a planarizing process such as polishing,
- removing residuals of said first conductive material 260 from regions above said top surface of said masking material 280 or if removed then fluorinated dielectric 250,
- optionally removing said masking material 280, if not removed previously,
- and repeating these process steps until the desired number of wiring and via levels have been fabricated.

EXAMPLE 3

A third preferred method for forming interconnect structures such as interconnect structure 400 shown in FIG. 8 comprises the method of Example 2 altered by the addition of the step of

- forming sidewall spacers 410 on the sidewalls of said cavities prior to filling said cavities with conductive material 250, material of said sidewall spacers 410 being selected from the group of fluorine-resistant materials which may or may not be conductive, and the substitution of the step of

- selecting a first conductive material 260 identified as fluorine-resistant, with the step of

- selecting a first conductive material 420 that may or may not be fluorine resistant include the refractory metal W and Ta, and the refractory metal nitrides and metal silicon nitrides including TaN, TaSiN, ZrN, ZrSiN, HfN, HfSiN, TiN, TiSiN, WN, WSiN, etc, and combinations thereof.

The step of forming sidewall spacers 410 is preferably performed by depositing a thin, blanket, conformal layer of sidewall spacer material over a patterned workpiece containing horizontal and vertical surfaces, and then performing an anisotropic etch to leave the spacer material on the vertical surfaces of the workpiece while removing it from the horizontal surfaces of the workpiece.

While the present invention has been described in an illustrative manner, it should be understood that the terminology used is intended to be in a nature of words of description rather than of limitation. For example, the teachings of this invention relating to the terms "fluorine-containing," "fluorinated," fluorine-containing," and "fluorine-resistant" may obviously be extended to cover the more general terms "halogen-containing," "halogenated," "halogen-containing," and "halogen-resistant."

It should be noted that in the drawing like elements or components are referred to by like and corresponding reference numerals.

Furthermore, while the present invention has been described in terms of several preferred embodiments, it is to be appreciated that those skilled in the art will readily apply these teachings to other possible variations of the inventions. For example, fluorinated dielectric-containing interconnect structures fabricated by non-Damascene methods may be similar but not exactly identical to the structures of FIGS. 4 through 8, although they would retain the essential structural elements of conductive wiring and vias isolated from a fluorinated dielectric by at least one fluorine-resistant capping material.

Having thus described our invention, what we claim as new and desire to secure by Letters Patent is:

1. An interconnect structure comprising one or more layers of fluorinated dielectric insulation and one or more layers of conductive wiring patterns electrically connected by conductive vias, said conductive wiring patterns and vias completely isolated from said fluorinated dielectric insulation by at least one fluorine-resistant capping material selected from the group consisting of Ag, Co, Cr, In, Ir, Mn, Pd, Pt, Sn, their oxides, fluorides, nitrides, and silicides, mixtures thereof, Si-containing DLC and Si-O-containing DLC.

2. The interconnect structure of claim 1 wherein said one or more layers of fluorinated dielectric insulation is selected from the group consisting of fluorinated diamond like carbon (FDLC), fluorinated amorphous carbon (FLAC), FDLC or FLAC with additives selected from the group containing H, Si, Ge, O, and N, fluorinated silicon glass (FSG), inorganic halogen-containing dielectrics, and organic halogen-containing dielectrics.

3. An interconnect structure comprising one or more layers of fluorinated dielectric insulation and one or more layers of conductive wiring patterns electrically connected by conductive vias, said conductive wiring pattern levels and vias isolated from the fluorinated dielectric on a first set of selected surfaces by at least one electrically insulating fluorine-resistant capping material, and isolated from the fluorinated dielectric on a second set of selected surfaces by at least one electrically conductive fluorine-resistant capping and/or liner material, at least one of said electrically conductive fluorine-resistant capping and/or liner material and said electrically insulating fluorine-resistant capping material selected from the group consisting of Ag, Co, Cr, In, Ir, Mn, Pd, Pt, Sn, their oxides, fluorides, nitrides and silicides, mixtures thereof, Si-containing diamond like carbon (DLC) and Si—O-containing DLC.

4. The interconnect structure of claim 3 wherein said one or more layers of fluorinated dielectric insulation is selected from the group consisting of fluorinated diamond like carbon (FDLC), fluorinated amorphous carbon, FDLC or FLAC with additives selected from the group containing H, Si, Ge, O, and N, fluorinated silicon glass (FSG), inorganic halogen-containing dielectrics, and organic halogen-containing dielectrics.

5. The interconnect structure of claim 3 wherein said electrically insulating fluorine-resistant capping material is selected from the group consisting of magnesium oxide (MgO), Si-containing DLC and Si—O-containing DLC.

6. The interconnect structure of claim 3 wherein said electrically conductive fluorine-resistant capping and/or liner material is selected from the group consisting of Cr, Co, and cobalt silicide ($CoSi_2$).

7. An interconnect structure comprising one or more layers of fluorinated dielectric insulation and one or more layers of conductive wiring patterns electrically connected by conductive vias, said conductive wiring pattern and vias isolated from said fluorinated dielectric insulation on a first set of selected surfaces by at least one electrically insulating fluorine-resistant capping material, and isolated from said fluorinated dielectric on a second set of selected surfaces by at least one fluorine-resistant sidewall capping material in combination with a conductive liner material, said electrically insulating fluorine-resistant capping material is selected from the group consisting of insulating oxides, nitrides, or fluorides of the elements Ag, Co, Cr, In, Ir, Mn, Sn, mixtures and multilayers thereof, Si-containing diamond like carbon (DLC), and Si—O-containing DLC.

8. The interconnect structure of claim 7 wherein said fluorine-resistant sidewall capping material is selected from the group consisting of, magnesium oxide (MgO), Cr, Co, Si-containing DLC and Si—O-containing DLC.

9. The interconnect structure of claim 8 wherein said one or more layers of fluorinated dielectric insulation is selected from the group consisting of fluorinated diamond like carbon (FDLC), fluorinated amorphous carbon (FLAC), FDLC or FLAC with additives selected from the group containing H, Si, O, and N, fluorinated silicon glass (FSG), inorganic halogen-containing dielectrics, and organic halogen-containing dielectrics.

10. The interconnect structure of claim 7 wherein said conductive liner material is selected from the group consisting of TaSiN, ZrN, ZrSiN, HfN, HfSiN, TiSiN, WN, WSiN and combinations thereof.

11. The interconnect structure of claim 8 wherein said electrically insulating fluorine-resistant capping material is selected from the group consisting of magnesium oxide (MgO), Si-containing DLC and Si—O-containing DLC.

12. The interconnect structure of claim 8 wherein said fluorine-resistant sidewall capping material is selected from the group consisting of Ag, Co, Cr, In, Ir, Mn, Pd, Pt, Sn, their oxides, fluorides, nitrides and silicides, mixtures thereof, Si-containing DLC and Si—O-containing DLC.

13. An interconnect structure comprising one or more layers of fluorinated dielectric insulation and one or more layers of conductive wiring patterns electrically connected by conductive vias, said conductive wiring pattern and vias isolated from said fluorinated dielectric insulation on a first set of selected surfaces by at least one electrically insulating fluorine-resistant capping material, and isolated from said fluorinated dielectric on a second set of selected surfaces by at least one conductive fluorine-resistant liner material in combination with a conductive liner material to provide a diffusion barrier to metal atoms in said conductive wiring patterns and vias, said electrically insulating fluorine-resistant capping material is selected from the group consisting of insulating oxides, nitrides, or fluorides of the elements Ag, Al—Cu, Co, Cr, In, Ir, Mn, Sn, mixtures and multilayers thereof, Si-containing diamond like carbon DLC and Si—O-containing DLC.

14. The interconnect structure of claim 13 wherein said one or more layers of fluorinated dielectric insulation is selected from the group consisting of fluorinated diamond like carbon (FDLC), fluorinated amorphous carbon (FLAC), FDLC or FLAC with additives selected from the group containing H, Si, Ge, O, and N, fluorinated silicon glass (FSG), inorganic halogen-containing dielectrics and inorganic halogen-containing dielectrics.

15. The interconnect structure of claim 13 wherein said electrically insulating fluorine-resistant capping material is selected from the group consisting of magnesium oxide (MgO), Si-containing DLC and Si—O-containing DLC.

16. The interconnect structure of claim 13 wherein said conductive fluorine-resistant liner material is selected from the group consisting of Ag, Co, Cr, In, Ir, Mn, Pd, Pt, Sn, their conductive oxides, fluorides, nitrides and silicides and mixtures thereof.

17. The interconnect structure of claim 13 wherein said conductive fluorine-resistant liner material is selected from the group consisting of Cr, Co, and cobalt silicide ($CoSi_2$).

18. The interconnect structure of claim 13 wherein said conductive liner material is selected from the group consisting of refractory metals W and Ta, and refractory metal nitrides and metal silicon nitrides including TaSiN, ZrN, ZrSiN, HfN, HfSiN, TiSiN, WN, and WSiN and layered combinations thereof.

* * * * *